(12) United States Patent
Kugimiya et al.

(10) Patent No.: US 7,471,521 B2
(45) Date of Patent: Dec. 30, 2008

(54) ELECTRONIC DEVICE, CIRCUIT BOARD AND CONVEX MEMBER

(75) Inventors: Tetsuya Kugimiya, Kawasaki (JP); Minoru Mukai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 324 days.

(21) Appl. No.: 11/193,452

(22) Filed: Aug. 1, 2005

(65) Prior Publication Data

US 2006/0199412 A1    Sep. 7, 2006

(30) Foreign Application Priority Data

Mar. 4, 2005    (JP) .............................. 2005-060839

(51) Int. Cl.
*H05K 7/02* (2006.01)
*H05K 7/04* (2006.01)

(52) U.S. Cl. .................. 361/810; 361/816; 361/818

(58) Field of Classification Search ......... 361/752–756, 361/807–810, 770–772; 174/51, 520–525
See application file for complete search history.

(56) References Cited

U.S. PATENT DOCUMENTS 5,150,086 A * 9/1992 Ito ............................ 333/182
5,371,653 A * 12/1994 Kametani et al. ........... 361/721
5,550,713 A * 8/1996 Pressler et al. ............. 361/818
5,635,928 A * 6/1997 Takagi et al. ................ 341/22
5,717,577 A * 2/1998 Mendolia et al. ........... 361/818
5,909,350 A * 6/1999 Anthony ..................... 361/118
6,037,846 A * 3/2000 Oberhammer .............. 333/182

FOREIGN PATENT DOCUMENTS

| JP | 2002-141682 | 5/2002 |
| JP | 3348973 | 11/2002 |

* cited by examiner

*Primary Examiner*—Tuan T Dinh
(74) *Attorney, Agent, or Firm*—Oblon, Spivak, McClelland, Maier & Neustadt, P.C.

(57) ABSTRACT

An electronic device includes: a circuit board having a convex-curved component and a housing having a support member with a concave-curved end and receiving the convex-curved component of the circuit board. The convex-curved component is freely turnable in the concave-curved end. Thereby, a simple structure prevents moments from being transmitted to the circuit board from a housing.

6 Claims, 11 Drawing Sheets

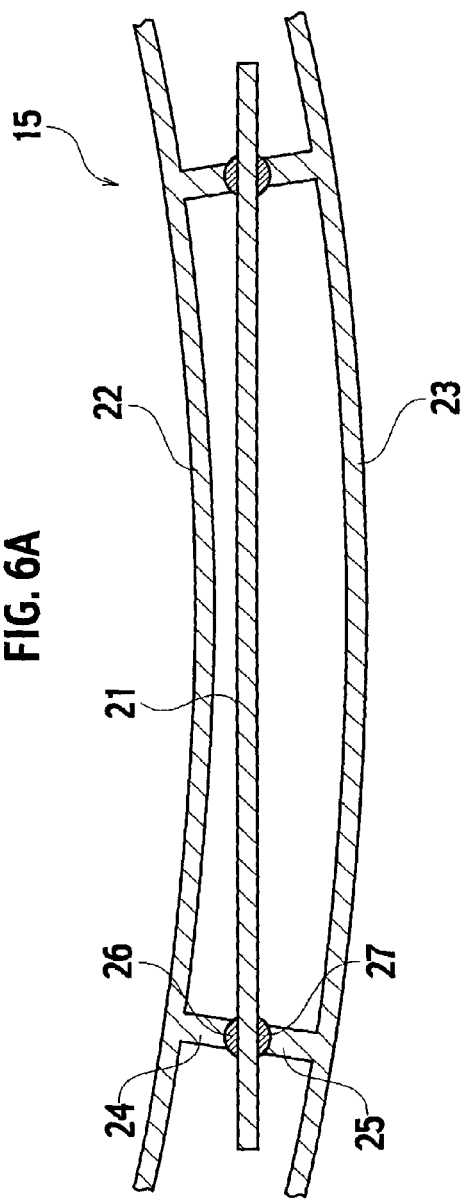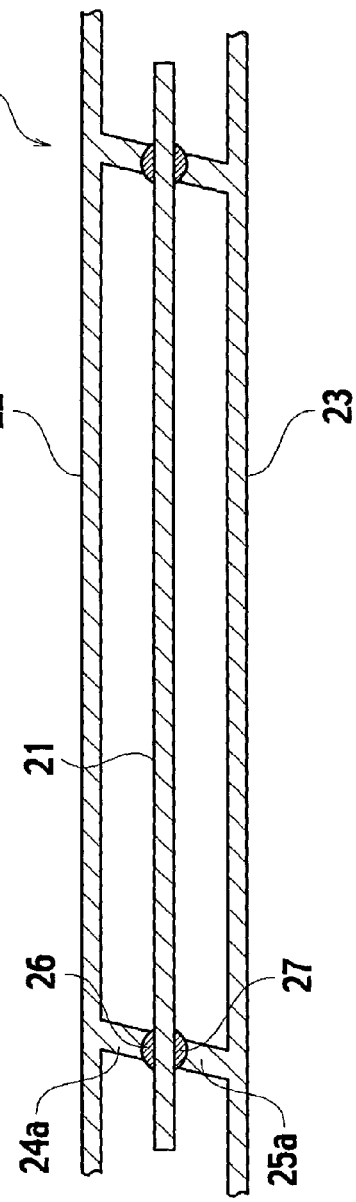

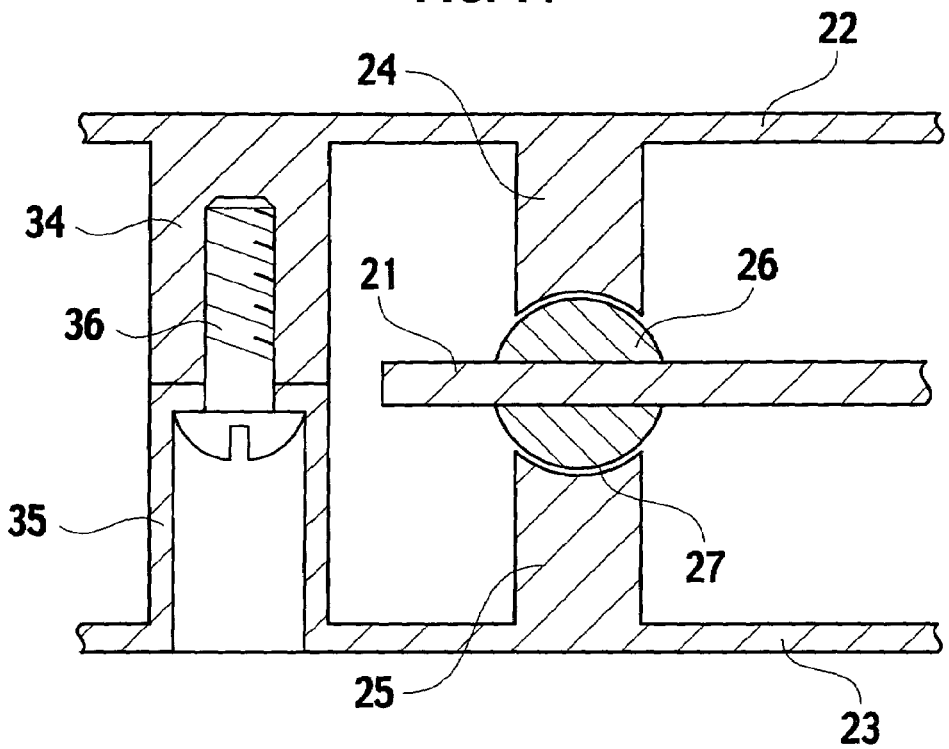
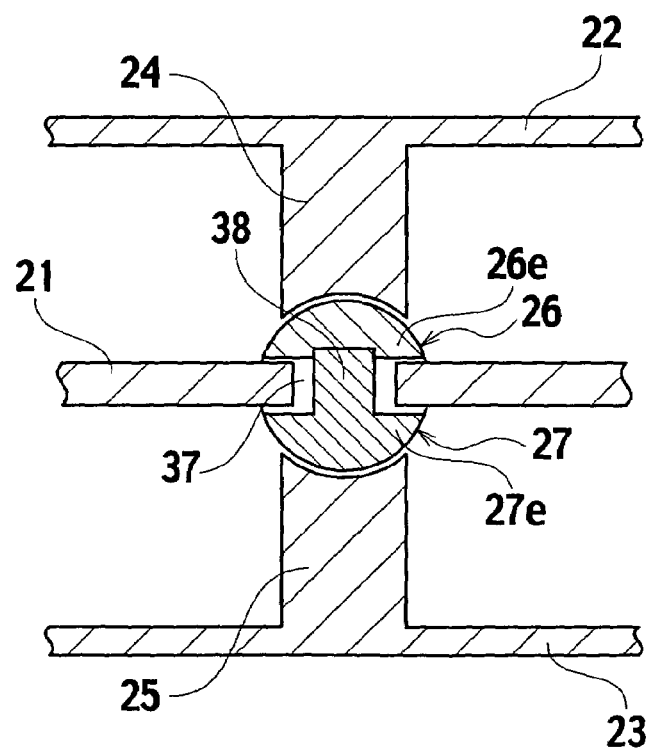

ELECTRONIC DEVICE, CIRCUIT BOARD AND CONVEX MEMBER

CROSS REFERENCE TO RELATED APPLICATIONS

This application is based upon and claims the benefit of priority from prior Japanese Application No. 2005-060839 filed on Mar. 4, 2005, the entire contents of which are incorporated by reference herein.

BACKGROUND OF THE INVENTION

1. Field of the Invention

The present invention relates to an electronic device and convex member for a circuit board, and more particularly to an electronic device and convex member holding up a circuit board in a housing.

2. Description of the Related Art

At present, laptops (i.e., portable microcomputers) are designed to be compact, light in weight and easy to carry. Such a portable microcomputer (called the "microcomputer") may be dropped while it is carried by a user. When dropped, a housing of the microcomputer may be deformed and undergo dropping impacts or external static loads.

It is assumed that a circuit board is fixedly mounted in the housing. If moments caused by the deforming housing are transmitted to the circuit board, the circuit board will be gradually warped. In such a case, interconnections on the circuit board and joints between the circuit board and semiconductor chips will be broken or damaged.

Especially, when the circuit board is made of materials having low rigidity in order to meet weight and thickness saving requirements, there is a large difference between the rigidity of the circuit board and that of elements mounted thereon. Therefore, the mounted elements will become defective when the circuit board is deformed.

In order to overcome the foregoing problem, a resin material is inserted between the circuit board and elements mounted thereon, thereby locally enhancing joints of the circuit board and elements. This measure is called the underfilling method. Refer to the Japanese patent No. 3,348,973.

However, it is very difficult in the foregoing method to exchange elements mounted on the circuit board. Further, the circuit board itself has to be exchanged when mounted elements are found to be defective. Therefore, the method is considered to be insufficient as a countermeasure.

Further, it has been proposed to support a circuit board using springs. In this case, cylindrical supports are fitted in openings on the circuit board. Each cylindrical support has one end thereof fixed to a housing, and has a flange on a side surface thereof. The circuit board is supported by springs inserted in the flanges of the cylindrical supports. This structure protects the circuit board against moments caused by the deformation of the housing.

However, the circuit board tends to be displaced in a direction which is vertical to the plane where elements are mounted. Especially, some connectors are directly mounted on the circuit board and extend outward via an open area of the housing. Further, the connectors have to be fixed to the housing in order that cables or the like are reliably attached to and detached from the connectors. In such a case, the connectors are a little bit displaced while the circuit board tends to be extensively displaced. Since the connectors and the circuit board are displaced in different amounts, joints between the connectors and the circuit board undergo an excessive deformation. Poor connections will be caused at the joints where the connectors and the circuit board are connected.

SUMMARY OF THE INVENTION

The present invention has been contemplated to overcome the foregoing problems of the related art and provides a microcomputer, a circuit board and convex members holding elements on the circuit board, all of which have simple structures and prevent moments from being transmitted to the circuit board from a housing.

According to a first aspect of the embodiment of the invention, there is provided an electronic device including: a circuit board including support structures which have convex-curved components; and a housing including support structures which have support members having concave-curved ends and receive the convex-curved components of the support structure of the circuit board.

In accordance with a second aspect, there is provided a circuit board including an element mounting surface and support structures provided on both surfaces of the element mounting surface and having convex-curved components.

In accordance with a third aspect, there is provided a convex member including first parts attached on one surface of a circuit board, and second parts received in concavities on a support member of the circuit board housing.

BRIEF DESCRIPTION OF THE DRAWINGS

FIG. 6A is a cross section of the circuit board when a housing of the microcomputer is deformed by moments applied in opposite directions;

FIG. 6B is a cross section of the circuit board when the housing is deformed by moments applied in the same direction;

FIG. 11 is a cross section of support structures for the circuit board in a modified example of the fourth embodiment;

FIG. 12 is a cross section of support structures fixedly attached to the circuit board in a fifth embodiment of the invention;

DETAILED DESCRIPTION OF THE INVENTION

Figure 1:
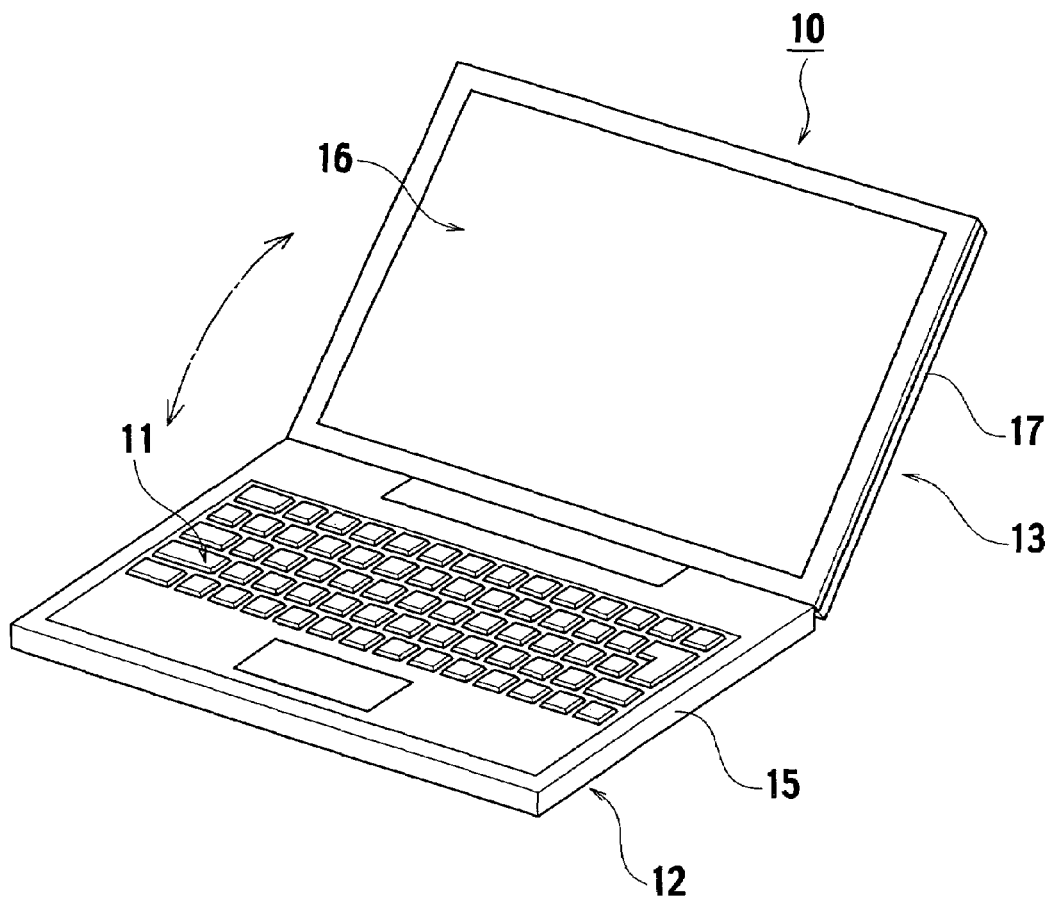
FIG. 1 is a perspective view of a microcomputer according to a first embodiment of the invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Referring to FIG. 1, a microcomputer 10 includes a main body 12 installed in a lower housing 15, and a display unit 13 installed in an upper housing 17. The main body 12 includes a keyboard 11, a central processing unit (CPU), a circuit board 21 with a memory and so on mounted thereon, and a hard disk drive (HDD). The CPU, circuit board 21 and hard disk drive HDD are installed in the lower housing 15. The display unit 13 is provided in the upper housing 17, and includes a liquid crystal display panel 16.

Figure 2:
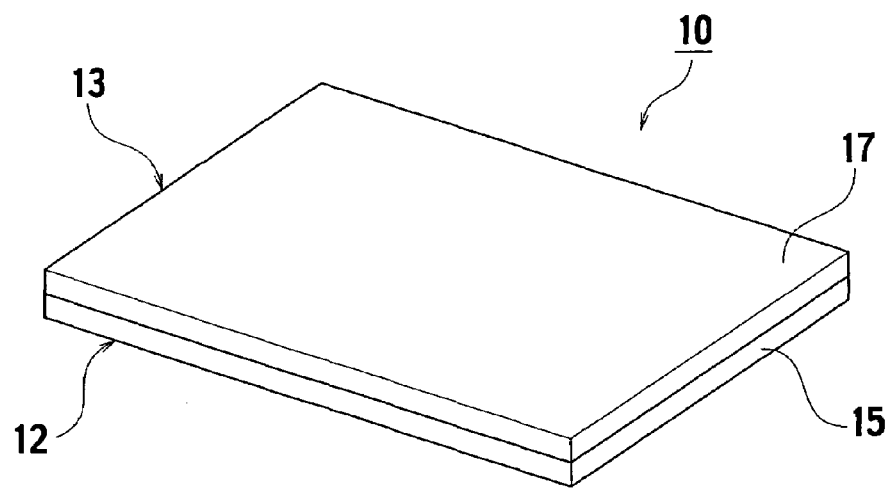
FIG. 2 is a perspective view of the microcomputer which is closed while it is carried.

The upper and lower housings 17 and 15 are hinged, which enables the upper housing 17 to be opened and closed with respect to the lower housing 15. When the upper housing 17 is opened, the keyboard 11 and the display unit 13 are oriented as shown in FIG. 1. On the other hand, the keyboard 11 and the display panel 16 face with each other when the upper and lower housings 17 and 15 are closed as shown in FIG. 2.

Figure 3:
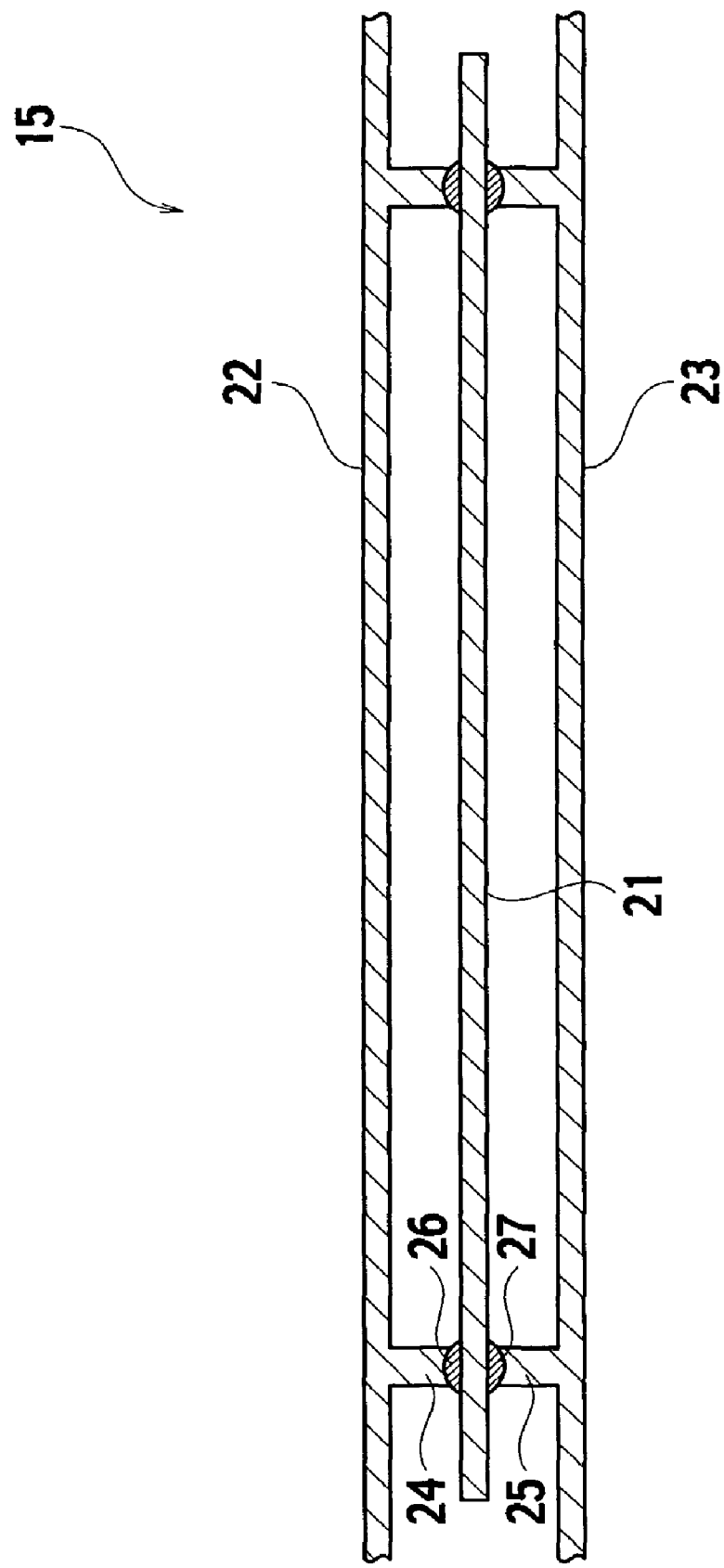
FIG. 3 is a cross section of support structures for a circuit board in the microcomputer.
Figure 4:
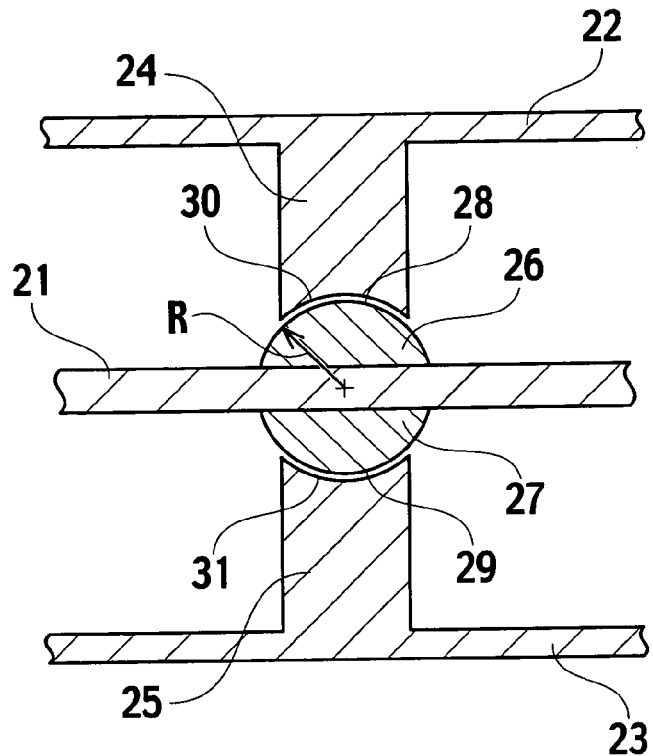
FIG. 4 is a cross section of the support structures of FIG. 3.

FIG. 3 shows that the circuit board 21 has its front and rear surfaces backed up by a support structure of the lower housing 15. The support structure of the lower housing 15 includes support shafts (support members) 24 and 25 having concave-curved ends, and upper and lower plates 22 and 23. The circuit board 21 has a support structure constituted by convex-curved components 26 and 27, which are received in the concave-curved ends of the support shafts 24 and 25. The convex-curved components 26 and 27 are opposite to each other on the front and rear surfaces of the circuit board 21. In other words, the upper and lower plates 22 and 23 constitute the lower housing 15 where the circuit board 21 is mounted. As shown in FIG. 4, the concave-curved ends of the support shafts 24 and 25 have a curvature radius R which is equal to that of the convex-curved components 26 and 27 of the support structure of the circuit board 21.

Figure 5:
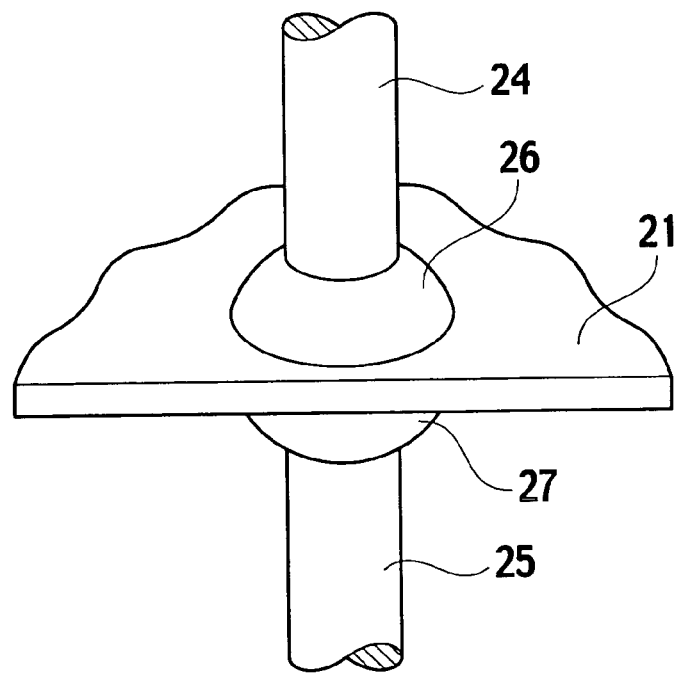
FIG. 5 is a perspective view of the support structures of FIG. 3.

The convex-curved components 26 and 27 and the concave-curved ends of the support shafts 24 and 25 are in the shape of a sphere which is concentric to the thickness center of the circuit board 21. FIG. 5 shows that the convex-curved components 26 and 27 are in slidable contact with the concave-curved ends of the support shafts 24 and 25. In short, the support shafts 24 and 25 are slidable in a desired direction with the central focus on the convex-curved components 26 and 27.

When external forces are applied to the microcomputer, the upper and lower plates 22 and 23 will be deformed in the lower housing 15, and make the support shafts 24 and 25 tilted. In such a case, the support shafts 24 and 25 slide on the convex-curved components 26 and 27, which prevents moments from being transmitted to the circuit board 21. For example, if reverse moments are applied as shown in FIG. 6A, the support shafts 24 and 25 slide via their concave-curved ends on the convex-curved components 26 and 27. This effectively prevents the moments from being transmitted to the circuit board 21. On the other hand, when moments are applied in the same direction as shown in FIG. 6B, the support shafts 24 and 25 slide via their concave-curved ends on the convex-curved components 26 and 27. This also effectively prevents the moments from being transmitted to the circuit board 21.

Figure 7:
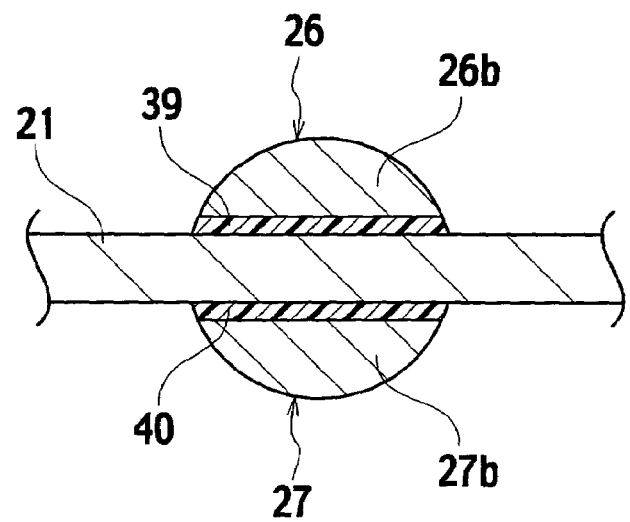
FIG. 7 is a cross section of the support structures of FIG. 5, which are fixedly attached to the circuit board.

FIG. 7 shows that a support structure of the circuit board 21 includes convex-curved components 26b and 27b which are independent from the circuit board 21. The support structure is bonded to the circuit board 21 using adhesives 39 and 40. Alternatively, the support structure may be attached using an adhesive tape, or may be soldered. In the latter case, the circuit board 21 is heated in a furnace with elements mounted thereon, and the support structure having the convex-curved components 26b and 27b is attached thereon in a reflow process.

In the first embodiment, the simplified structure can protect the circuit board 12 against the moments caused by the deformed lower housing 15. Therefore, it is possible to protect wirings on the circuit board 21 against breaking, and against poor joints between semiconductor chips and the circuit board 21.

Second Embodiment

In a second embodiment, convex-curved components 26 and 27 of the circuit board 21 have a curvature radius which is smaller than that of the concave-curved ends of the support shafts 24 and 25.

Figure 8:
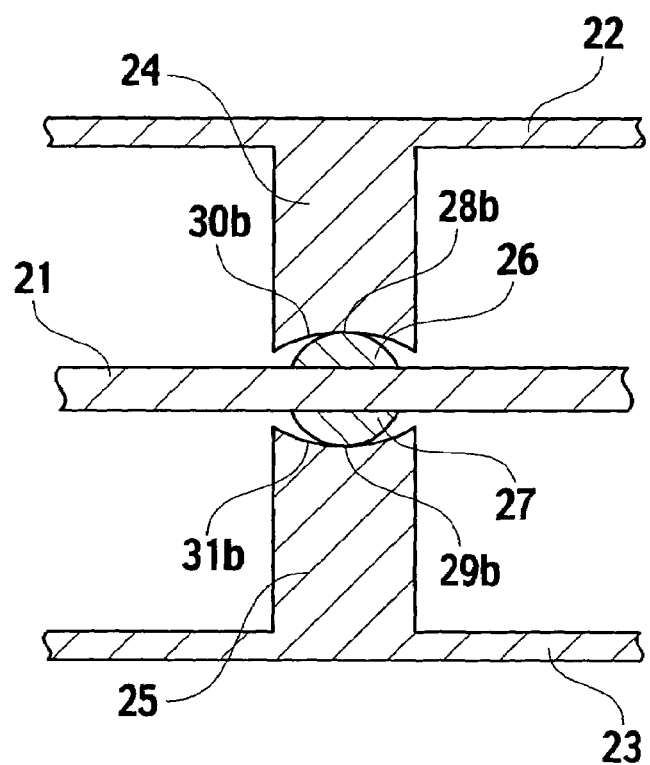
FIG. 8 is a cross section of support structures for the circuit board in a second embodiment of the invention.

Specifically, as shown in FIG. 8, the curvature radius of the convex-curved components 26 and 27 is smaller than that of concave-curved ends 30b and 31b of the support shafts 24 and 25. The convex-curved components 26 and 27 are freely turnable in the concave-curved ends of the support shafts 24 and 25 in a direction along the plane of the circuit board 21. Even if the circuit board 21 laterally expands or is constricted due to temperature variations and the convex-curved components 26 and 27 are moved along the circuit board 21, no loads will be applied to the circuit board 21 or the support shafts 24 and 25.

Therefore, the shafts 24 and 25 prevent the circuit board 21 from being deformed by loads.

In addition to the advantage of the first embodiment, the second embodiment can protect the circuit board 21 against thermal strains.

Third Embodiment

Figure 9:
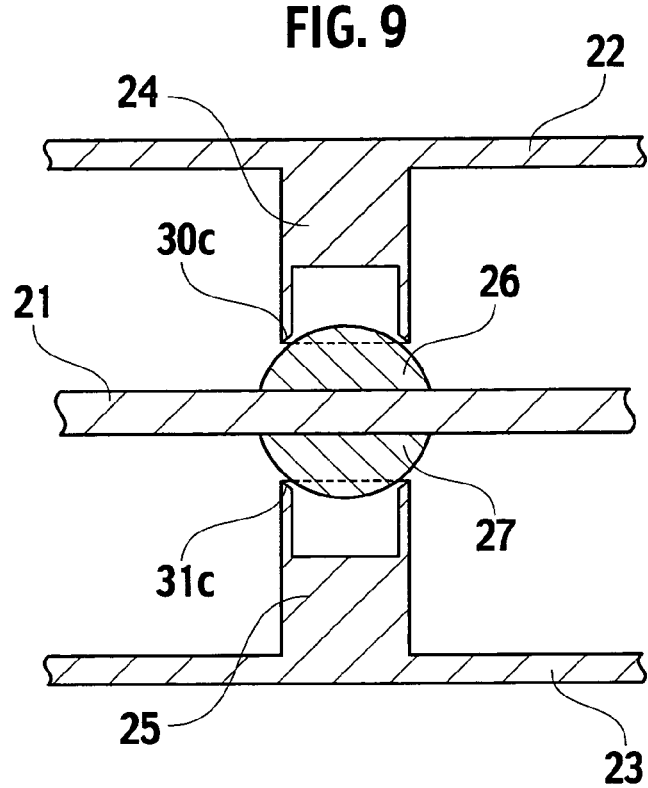
FIG. 9 is a cross section of support structures for the circuit board in a third embodiment of the invention.

In a third embodiment, support shafts 24 and 25 are partly hollow as shown in FIG. 9. Ring-shaped peripheries 30c and 31c of the support shafts 24 and 25 are beveled by a curvature radius which is equal to that of convex-curved components 26 and 27 of the circuit board 21.

It is possible to reduce the volume of the support shafts 24 and 24, which makes the microcomputer light in weight as a whole.

Alternatively, the convex-curved components 26 and 27 may be supported by support shafts 24 and 25 of which peripheral edges are partially cut.

Fourth Embodiment

Figure 10:
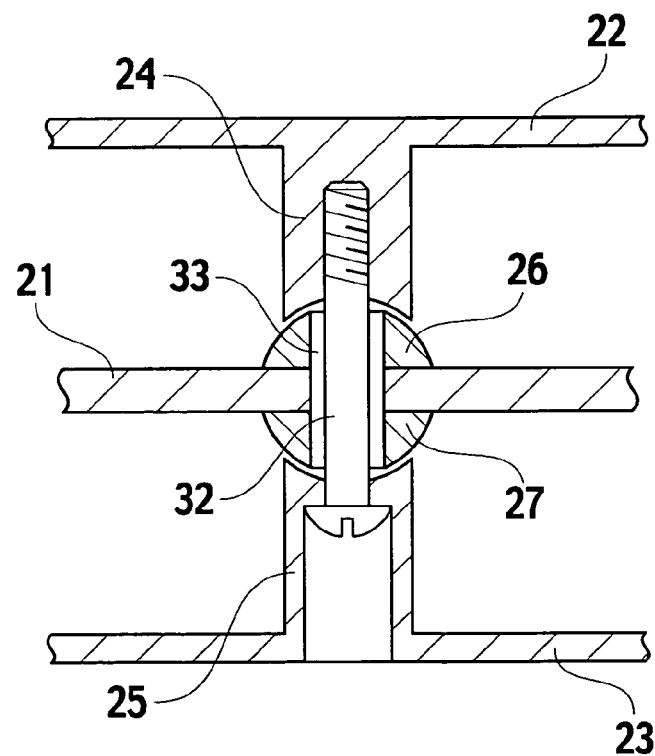
FIG. 10 is a cross section of support structures fixedly attached to the circuit board in a fourth embodiment of the invention.

In this embodiment, the circuit board 21 is fastened to the support structure of the lower housing 15 using a cylindrical screw 32. Referring to FIG. 10, the support shaft 24 has an opening which receives the screw 32. A through-hole 33 extends through convex-curved components 26 and 27 and a circuit board 21. The through-hole 33 is larger than the screw 32. The screw 32 is inserted into the circuit board 21 through a support shaft 25 and the through-hole 33, so that the support shafts 24 and 25 are connected.

The inner diameter of the through-hole 33 is larger than the diameter of the screw 32, so that the screw 32 fixed in the support shafts 24 and 25 is rotatable through the circuit board 21. The support shafts 24 and 25 are turnably connected to each other via the convex-curved components 26 and 27. The support shafts 24 and 25 also function as a joint connecting the upper and lower plates 22 and 23.

The support shafts 24 and 25 support not only the convex-curved components 26 and 27 of the circuit board 21 but also connect the upper and lower plates 22 and 23. This is effective in reliably preventing the support shafts 24 and 25 from being disengaged from the convex-curved components 26 and 27 even when an external force is applied to the microcomputer.

In addition to the advantage of the first embodiment, the fourth embodiment can prevent the support shafts 24 and 25 from being disengaged from the convex-curved components 26 and 27 of the circuit board 21.

If the support shafts 24 and 25 are too thin to make an opening for the screw 32, as shown in FIG. 11, fastening parts 34 and 35 may be provided near the support shafts 24 and 25 in order to join the upper and lower plates 22 and 23 using a screw 36.

Fifth Embodiment

Figure 13:
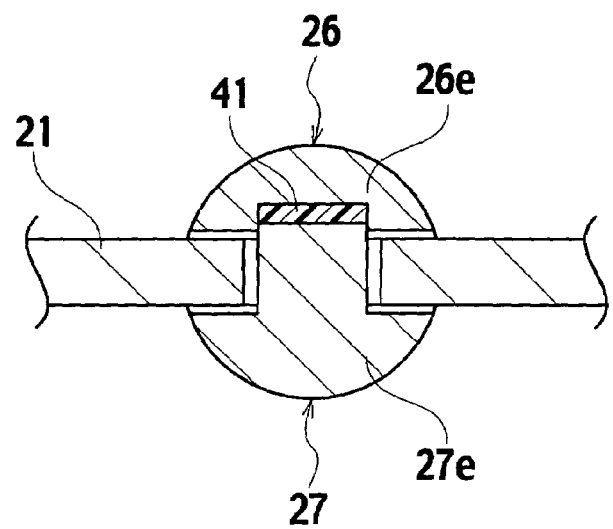
FIG. 13 is a cross section of support structures fixedly attached to the circuit board in a modified example of the fifth embodiment.

In this embodiment, the convex-curved components 26 and 27 are movable along the circuit board 21. Referring to FIG. 12, the circuit board 21 has a through-hole 37 along its thickness, into which a projection 38 of a convex-curved component 27e is fitted. The projection 38 is fixed to a convex-curved component 26e, using an adhesive 41, or an adhesive tape or the like as shown in FIG. 13.

An inner diameter of the through-hole 37 of the circuit board 21 is larger than an outer diameter of the projection 38 of the convex-curved component 27, so that there is a gap between the through-hole 37 and the projection 38. This structure enables the projection 38 to be movable in the through-hole 37 at maximum in a direction where the circuit board 21 extends.

The convex-curved components 26 and 27 are movable along the circuit board 21. For instance, when there is a difference between a thermal expansion coefficient of the upper and lower plates 22 and 23 and a thermal expansion coefficient of the circuit board 21, the convex-curved components 26 and 27 can absorb a lateral expansion or constriction of the circuit board 21 due to temperature variations.

The foregoing structure can protect wirings on the circuit board 21 against breaking, and prevent poor connections between the circuit board 21 and elements mounted thereon.

In addition to the advantage of the first embodiment, the fifth embodiment can prevent the circuit board 21 from being deformed due to thermal strains.

Sixth Embodiment

Figure 14:
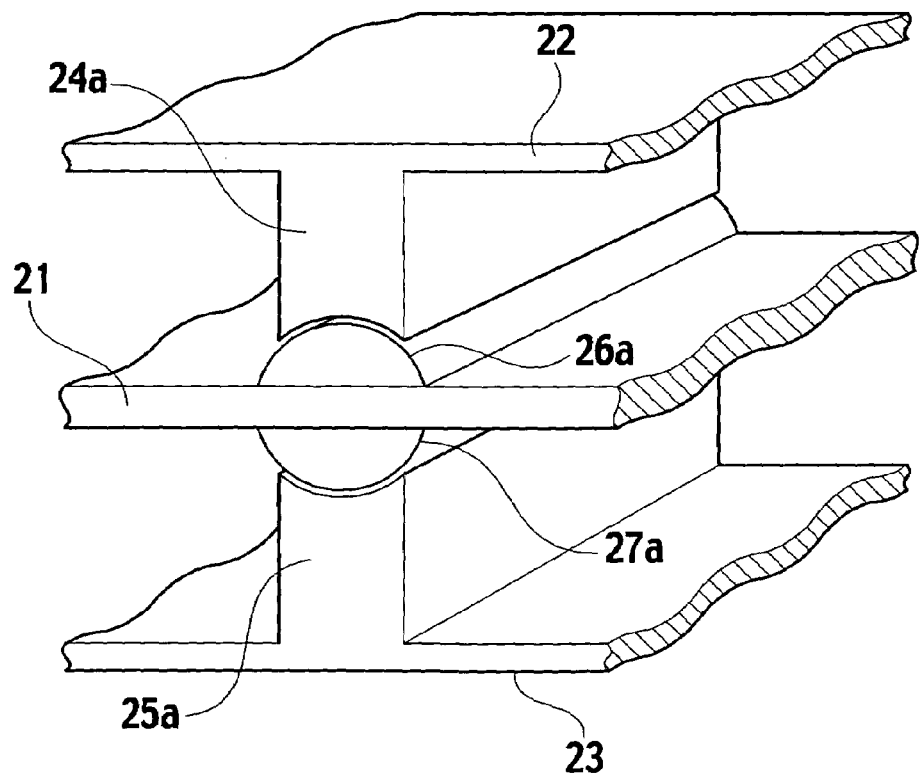
FIG. 14 is a cross section of support structures fixedly attached to the circuit board in a sixth embodiment.

According to this embodiment, the circuit board 21 has a support structure constituted by a pair of semi-cylindrical ribs 26a and 27a in place of the convex-curved components 26 and 27. As shown in FIG. 14, the semi-cylindrical ribs 26a and 27a are attached to the circuit board 21 using an adhesive or the like. Support walls 24a and 25a are provided on the upper and lower plates 22 and 23, and have concave-curved ends thereof. The concave-curved ends have a curvature radius equal to that of the semi-cylindrical ribs 26a and 27a.

If only uniaxial moments are transmitted to the circuit board 21, an amount of rotational freedom of the walls 24a and 25a may be equal to an amount of freedom of the moments. Therefore, the walls 24a and 25a can reliably support the circuit board 21 via the semi-cylindrical ribs 26a and 27a.

The walls 24a and 25a extend along the semi-cylindrical ribs 26a and 27a, can make the upper and lower plates 22 and 23 more rigid, and increase contact areas with the semi-cylindrical ribs 26a and 27a. This structure is effective in preventing the circuit board 21 from warping due to its own weight.

In the sixth embodiment, the support walls 24a and 25a have the uniaxial rotational freedom and extend in the direction of the rotary shaft, and support the semi-cylindrical ribs 26a and 27a, which enables the circuit board 21 to be free from moments caused by the deformed housing, and from warping by its own weight.

Other Embodiments

Figure 15:
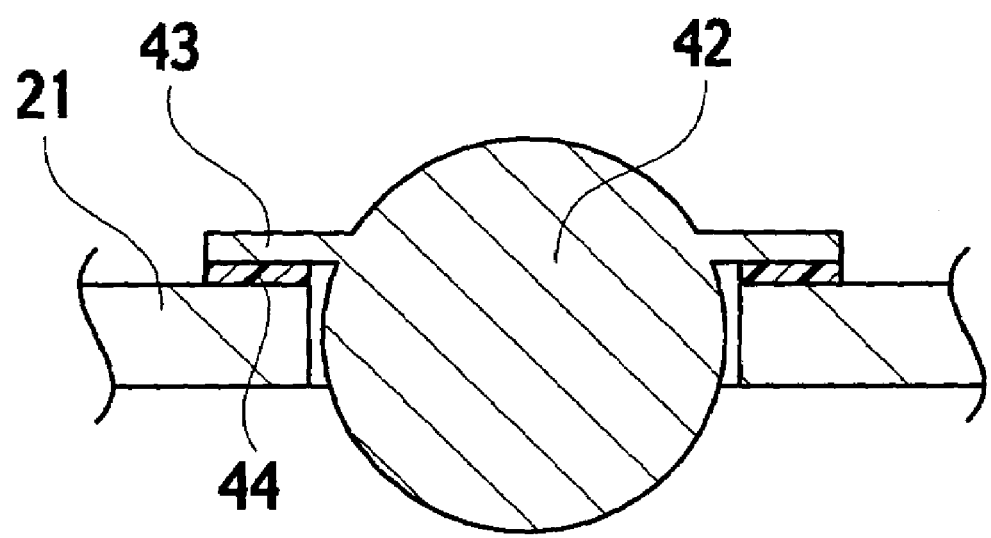
FIG. 15 is a cross section of support structures in a modified example of the sixth embodiment.

In the foregoing embodiments, the convex-curved components 26 and 27 are provided on both surfaces of the circuit board 21. Alternatively, a ball 42 may be fitted into a through-hole in the circuit board 21 as shown in FIG. 15. The ball 42 has a flange 43 which is fixed to the circuit board 21 using an adhesive 44 or an adhesive tape. Further, the flange 43 may be soldered. In this case, the balls 42 function as the convex-curved components 26 and 27.

The use of the ball 42 as the support structure is effective in reducing the number of components. Further, the ball 42 may be swaged or screwed to the circuit board 21.

Figure 16A:
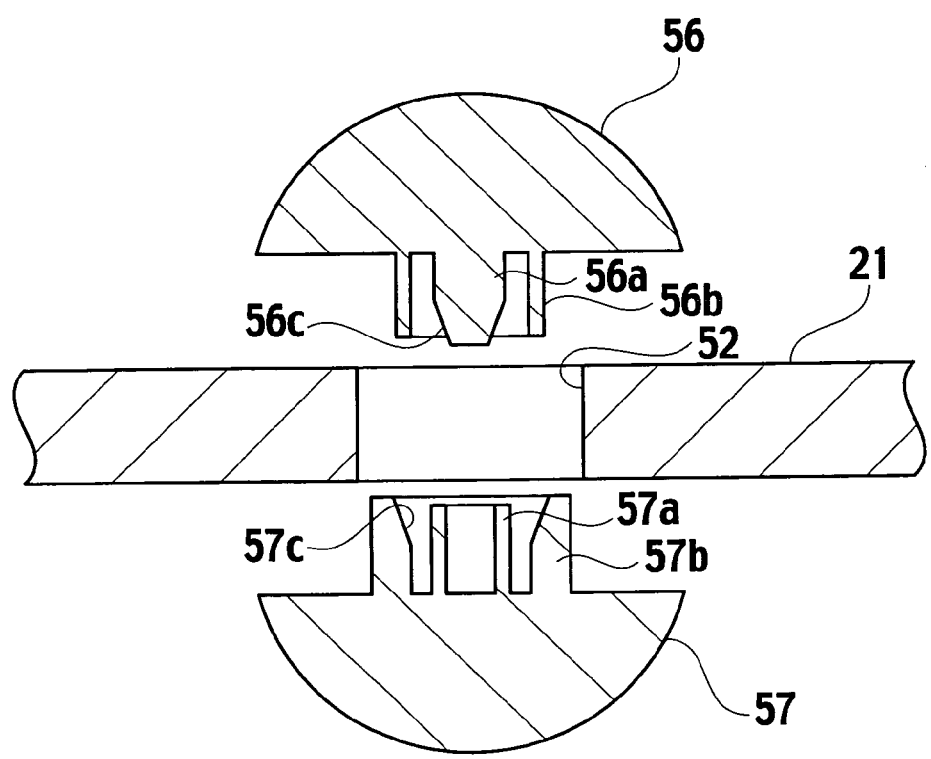
FIG. 16A and FIG. 16B are cross sections of the support structures showing how the circuit board is attached in a further embodiment.

FIG. 16A shows that a pair of hemispherical components 56 and 57 are attached to the circuit board 21. Specifically, the hemispherical component 56 has a cylindrical projection 56a on the bottom thereof, and a cylindrical part 56b. The cylindrical projection 56a has a tapered end. The curved component 57 has, on its bottom, a cylindrical part 57a and a cylindrical part 57b surrounding the cylindrical part 57a.

The circuit board 21 has a through-hole 52 which is slightly thicker than the cylindrical part 57b. Via the through-hole 52, the cylindrical projection 56a is fitted in the cylindrical part 57a, and the cylindrical part 56b is engaged with the cylindrical part 57b.

Figure 16B:
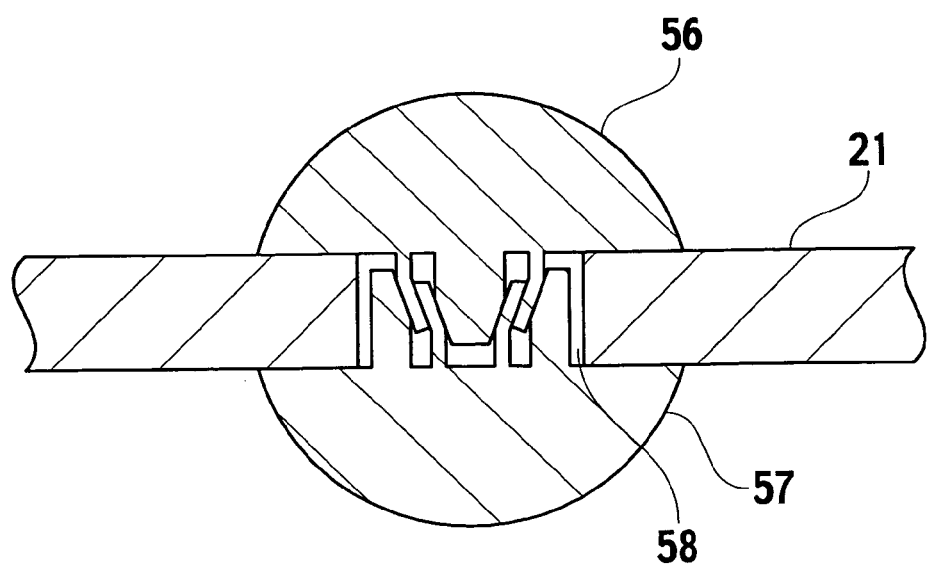

The hemispherical components 56 and 57 are swaged, and fixedly and reliably attached to the circuit board 21 as shown in FIG. 16B.

In this case, an outer diameter of the cylindrical part 57b is smaller than the diameter of the through-hole 52, so that a gap 58 is formed between the cylindrical part 57b and the through-hole 52. Therefore, the hemispherical components 56 and 57 are movable along the circuit board 21, which prevents the circuit board 21 from being deformed due to thermal strains.

Figure 17A:
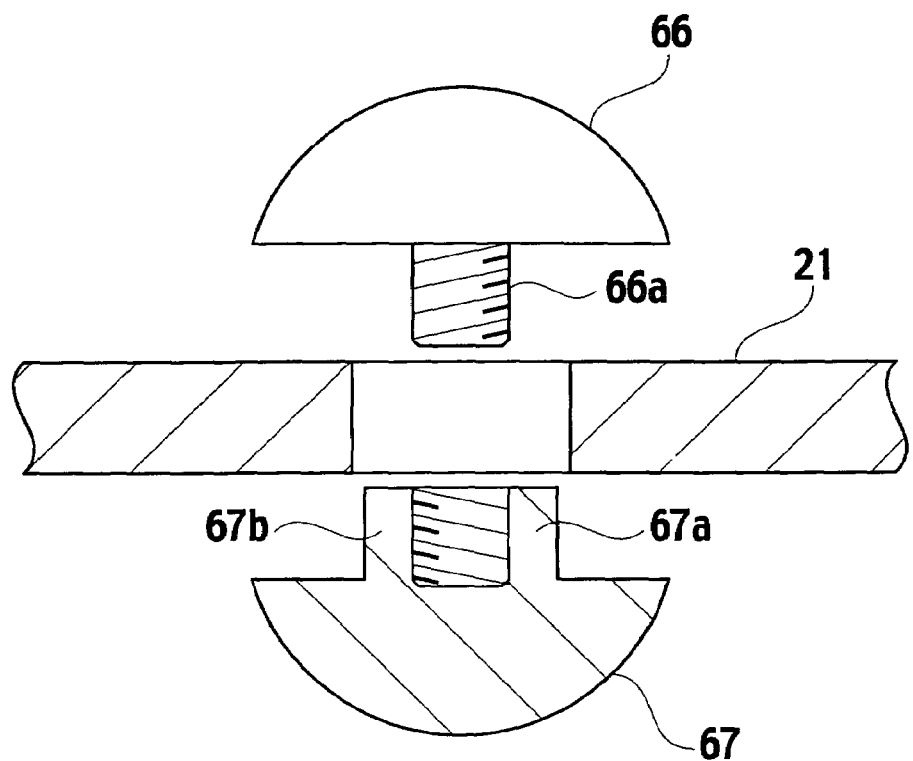
FIG. 17A and FIG. 17B are cross sections of the support structures showing how the circuit board is attached in a still further embodiment.
Figure 17B:
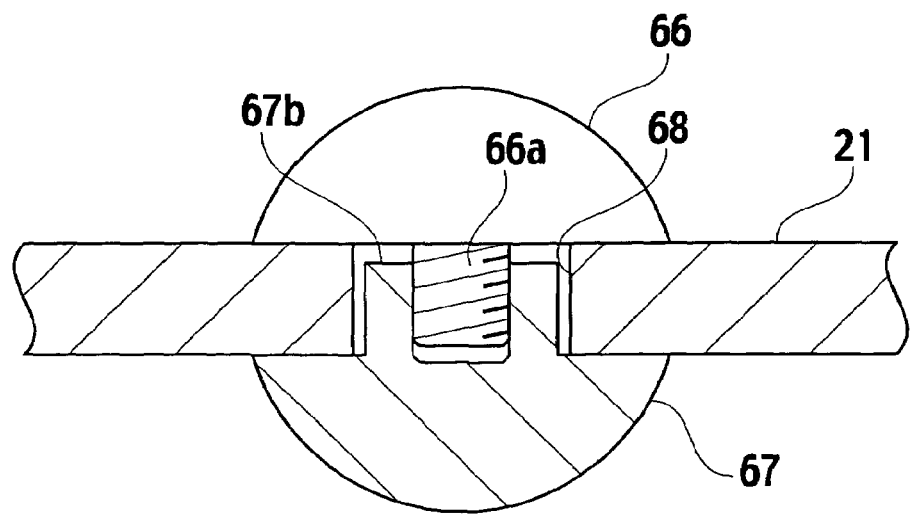

Alternatively, the hemispherical components 66 and 67 may be screwed to the circuit board 21 as shown in FIGS. 17A and 17B. Referring to FIG. 17A, the hemispherical component 66 has a threaded projection 66a at the bottom thereof while the hemispherical component 67 has a cylindrical projection 67b which has a threaded hole 67a.

The circuit board 21 has a through-hole 68, via which the threaded projection 66a is engaged in the threaded hole 67a.

The hemispherical components 66 and 67 are reliably fixed to the circuit board 21 similarly to the convex-curved components 56 and 57 shown in FIG. 16B.

When an outer diameter of the projection 67b is smaller than an inner diameter of the through-hole 68 of the circuit board 21, the hemispherical components 66 and 67 are movable along the circuit board 21. This is effective in preventing the circuit board 21 from being deformed due to thermal strains.

The present invention is applicable to portable walkie-talkies and various electronic devices as well as the portable microcomputer 10.

What is claimed is:

1. An electronic device comprising:
    a circuit board having top and bottom surfaces,
    first and second convex-curved components provided on the top and bottom surfaces of the circuit board; and
    a housing having first and second support members with concave-curved ends and receiving the first and second convex-curved components of the circuit board, wherein each of the first and second convex-curved components is freely turnable in the concave-curved end in a direction along a plane of the circuit board.

2. The electronic device of claim 1, wherein the convex-curved component of the circuit board forms a spherical shape and the concave-curved end of the support structure of the housing forms a spherical space.

3. The electronic device of claim 1, wherein the convex-curved component of the circuit board and the concave-curved end of the support structure of the housing form the shape of an arc with respect to a cross section of the circuit board.

4. The electronic device of claim 1, wherein the convex-curved component of the circuit board has a curvature radius smaller than a curvature radius of the concave-curved end of the support member of the housing.

5. The electronic device of claim 1, wherein the convex-curved component of the circuit board is movable along a surface of the circuit board on which an element is mounted.

6. The electronic device of claim 5, wherein the convex-curved component of the circuit board has a projection fitted into the through hole and has an outer diameter smaller than an inner diameter of the through-hole.

* * * * *